US011588299B2

(12) United States Patent
Iakovlev et al.

(10) Patent No.: US 11,588,299 B2
(45) Date of Patent: Feb. 21, 2023

(54) VERTICAL-CAVITY SURFACE-EMITTING LASER FABRICATION ON LARGE WAFER

(71) Applicant: Mellanox Technologies, Ltd., Yokneam (IL)

(72) Inventors: Vladimir Iakovlev, Yokneam (IL); Yuri Berk, Yokneam (IL); Elad Mentovich, Yokneam (IL); Tamir Sharkaz, Yokneam (IL)

(73) Assignee: Mellanox Technologies, Ltd., Yokneam (IL)

( * ) Notice: Subject to any disclaimer, the term of this patent is extended or adjusted under 35 U.S.C. 154(b) by 284 days.

(21) Appl. No.: 16/841,824

(22) Filed: Apr. 7, 2020

(65) Prior Publication Data

US 2021/0313770 A1 Oct. 7, 2021

(51) Int. Cl.
*H01S 5/18* (2021.01)
*H01S 5/183* (2006.01)
(Continued)

(52) U.S. Cl.
CPC ...... *H01S 5/1838* (2013.01); *H01L 21/02392* (2013.01); *H01L 21/02543* (2013.01);
(Continued)

(58) Field of Classification Search
CPC .... H01S 5/1838; H01S 5/0042; H01S 5/0201; H01S 5/0202; H01S 5/0421;
(Continued)

(56) References Cited

U.S. PATENT DOCUMENTS 5,724,376 A * 3/1998 Kish, Jr. ............... H01S 5/183
372/36
10,396,527 B2 8/2019 Sirbu et al.
(Continued)

OTHER PUBLICATIONS

Bäcker, Alexandra et al. *Transverse Optical Mode Analysis of Long-Wavelength VCSELs For High Single-Mode Power Operation*, 2008 International Conference On Numerical Simulation Of Optoelectronic Devices (NUSOD), (2008), pp. 87-88. DOI: 10.1109/NUSOD.2008.4668255.
(Continued)

*Primary Examiner* — S M Sohel Imtiaz
(74) *Attorney, Agent, or Firm* — Alston & Bird LLP (57) ABSTRACT

Methods for fabricating vertical cavity surface emitting lasers (VCSELs) on a large wafer are provided. An un-patterned epi layer form is bonded onto a first reflector form. The first reflector form includes a first reflector layer and a wafer of a first substrate type. The un-patterned epi layer form includes a plurality of un-patterned layers on a wafer of a second substrate type. The first and second substrate types have different thermal expansion coefficients. A resulting bonded blank is substantially non-varying in a plane that is normal to an intended emission direction of the VCSEL. A first regrowth is performed to form first regrowth layers, some of which are patterned to form a tunnel junction pattern. A second regrowth is performed to form second regrowth layers. A second reflector form is bonded onto the second regrowth layers, wherein the second reflector form includes a second reflector layer.

20 Claims, 6 Drawing Sheets

(51) Int. Cl.
*H01S 5/042* (2006.01)
*H01S 5/30* (2006.01)
*H01S 5/00* (2006.01)
*H01S 5/20* (2006.01)
*H01S 5/02* (2006.01)
*H01S 5/343* (2006.01)
*H01L 21/18* (2006.01)
*H01L 21/02* (2006.01)
*H01L 21/306* (2006.01)
*H01L 21/283* (2006.01)
*H01L 21/32* (2006.01)

(52) U.S. Cl.
CPC .......... *H01L 21/187* (2013.01); *H01L 21/283* (2013.01); *H01L 21/30612* (2013.01); *H01L 21/32* (2013.01); *H01S 5/0042* (2013.01); *H01S 5/0201* (2013.01); *H01S 5/0202* (2013.01); *H01S 5/0421* (2013.01); *H01S 5/18327* (2013.01); *H01S 5/2013* (2013.01); *H01S 5/3095* (2013.01); *H01S 5/34313* (2013.01)

(58) Field of Classification Search
CPC .. H01S 5/18327; H01S 5/2013; H01S 5/3095; H01S 5/34313; H01S 5/02251; H01S 5/18308; H01S 5/34306; H01S 5/18341; H01S 5/0217; H01L 21/02392; H01L 21/02543; H01L 21/187; H01L 21/283; H01L 21/30612; H01L 21/32
See application file for complete search history.

(56) References Cited

U.S. PATENT DOCUMENTS

| | | | | |
|---|---|---|---|---|
| 2002/0101894 A1* | 8/2002 | Coldren | .............. | H01S 5/18316 216/11 |
| 2003/0025171 A1* | 2/2003 | Geske | ............... | H01L 21/02546 257/455 |
| 2006/0227835 A1* | 10/2006 | Ueki | ................... | H01S 5/18341 372/50.124 |
| 2008/0137692 A1* | 6/2008 | Park | ....................... | B82Y 20/00 372/4 |
| 2012/0134381 A1* | 5/2012 | Sirbu | .................... | B82Y 20/00 257/E21.085 |
| 2014/0273323 A1* | 9/2014 | Kim | .................... | H01L 29/2003 438/312 |
| 2018/0366905 A1* | 12/2018 | Sirbu | .................... | H01S 5/2081 |
| 2020/0244040 A1* | 7/2020 | Wang | ................... | H01S 5/18311 |

OTHER PUBLICATIONS

Caliman, A. et al. *25 Gbps Direct Modulation and 10 km Data Transmission With 1310 nm Wavebanand Wafer Fused VCSELs,* Optics Express, vol. 24, No. 15, Jul. 25, 2016, pp. 16329-16335. DOI: 10.1364/OE.24.016329.

Feezell, D. et al. *InP-Based 1.3-1.6 μm VCSELs With Selectively Etched Tunnel-Junction Apertures On A Wavelength Flexible Platform,* IEEE Photonics Technology Letters; vol. 17, No. 10; Oct. 2005; pp. 2017-2019.

Kapon, Eli et al. *Power-Efficient Answer,* Nature Photonics, vol. 3; Jan. 2009, pp. 27-29.

Lin, Chao-Kun et al. *High Temperature Continuous-Wave Operation of 1.3- and 1.55-μm VCSELs With InP/Air-Gap DBRs,* IEEE Journal of Selected Topics In Quantum Electronics, vol. 9, No. 5, Sep./Oct. 2003, pp. 1415-1421.

Sirbu, Alexei et al. *Reliability Of 1310 nm Wafer Fused VCSELs,* IEEE Photonics Technology Letters; vol. 25, No. 16, Aug. 15, 2013, pp. 1555-1558.

Sirbu, Alexei et al. *Wafer-Fused Heterostructures: Application To Vertical Cavity Surface-Emitting Lasers Emitting in the 1310 nm Band,* Semiconductor Science and Technology; vol. 26 (2011) 014016 (6 pages), Nov. 29, 2010.

Spiga, Silvia et al. *Single-Mode 1.5-μm VCSEL With 22-GHZ Small-Signal Bandwidth,* In Optical Fiber Communication Conference, OSA Technical Digest, Optical Society of America, (2016), paper Tu3D.4.

Spiga, Silvia et al. *Single-Mode 1.5-μm VCSELs With Small-Signal Bandwidth Beyond 20 GHZ,* 2016 18th International Conference on Transparent Optical Networks (ICTON) Jul. 10, 2016, pp. 1-4. IEEE. DOI:10.1109/ICTON.2016.7550332.

* cited by examiner

VERTICAL-CAVITY SURFACE-EMITTING LASER FABRICATION ON LARGE WAFER

TECHNICAL FIELD

Various embodiments relate to the fabrication of vertical-cavity surface-emitting lasers (VCSELs). For example, various embodiments relate to the fabrication of VCSELs on large wafers (e.g., three inches or more across in at least one dimension).

BACKGROUND

VCSELs are generally fabricated on a wafer with a plurality of VCSELs being fabricated on the same wafer. After the plurality of VCSELs are fabricated on the wafer, the wafers are separated using a dicing procedure. The only type of VCSELs emitting in a wavelength range between 1200 and 1600 nm that have demonstrated long term reliability are fabricated by separately preparing two reflector blanks and a patterned active region blank then assembling them together using wafer bonding[1]. The bonded reflector blanks and the patterned active region blank provide an active region sandwiched between two reflectors. However, due to thermal expansion coefficient differences between the materials of the reflector blanks and the patterned active region blank, properly aligning the patterned features presents a technical problem and reduces the fabrication efficiency.

[1] U.S. Pat. No. 10,396,527, issued Aug. 27, 2019.

BRIEF SUMMARY

The use of VCSELs for optical transmission in fiber optic systems has provided several advantages over commonly used edge-emitting lasers. For example, VCSELs require less power consumption and can be manufactured more efficiently than edge-emitting lasers. One aspect of this efficiency is provided by the on-wafer testing capability of VCSELs. The on-wafer testing results in a considerable cost advantage compared with conventional testing techniques used for edge emitting lasers. Furthermore, VCSELs provide reliable operation over time, which is essential for applications in fiber optic systems.

To meet the continuously growing demands for increased bandwidth in telecommunication networks, caused by growing data traffic in big data centers as well as in local and access networks, the inventors have recognized a need for an optimized, high-speed VCSELs with indium phosphide (InP) based active regions that can be applied in optical links that can transmit over long distances (e.g. more than 2 kilometers), which is not possible with standard VCSELs comprising gallium arsenide (GaAs) based active regions.

VCSELs are generally fabricated on a wafer with a plurality of VCSELs being fabricated on the same wafer. After the plurality of VCSELs are fabricated on the wafer, the wafers are separated using a dicing procedure. Prior to the present invention, VCSELs were fabricated by separately preparing reflector blanks and an active region blank followed by bonding them together to provide an active region sandwiched between two reflectors. However, due to thermal expansion coefficient differences between the materials of the reflector blanks and the patterned active region blank, properly aligning the patterned features of the active region blank presents a technical problem and reduces the fabrication efficiency.

Various embodiments provide technical solutions to this technical problem. In particular, various embodiments provide an efficient VCSEL fabrication process that allows for dependable alignment of VCSEL features. In various embodiments, the VCSEL fabrication process comprises preparing a first reflector form, a second reflector form, and an un-patterned partial epi layer form. The first reflector form comprises a GaAs substrate and a first reflector. The second reflector form comprises a GaAs substrate and a second reflector. The un-patterned partial epi layer form comprises an InP substrate and multiple un-patterned InP and/or InGaAsP layers. The un-patterned partial epi layer form is bonded onto the first reflector form. After the InP substrate is removed, a first regrowth process is performed, a patterning process is performed to pattern the tunnel junction, and a second regrowth process is performed. The second reflector form is then bonded onto the regrown layers. The removal of the GaAs substrate of the second reflector, processing, and contact deposition allow the VCSELs to be tested on the wafer and/or separated (e.g., using a dicing procedure).

According to an aspect of the invention, a method for fabricating a VCSEL is provided. The method comprises bonding of an un-patterned epi layer form onto a first reflector form. The first reflector form includes a first reflector on a wafer of a first substrate type. The un-patterned epi layer form includes a plurality of un-patterned epitaxially grown layers on a wafer of a second substrate type, the first and the second substrate types having different thermal expansion coefficients. The method further comprises removing the wafer of the second substrate type to form a bonded blank. The bonded blank is substantially non-varying in an xy plane, where the xy plane is normal to an intended emission direction of the VCSEL. The method further comprises performing a first regrowth to form first regrowth layers on the un-patterned epitaxially grown layers; patterning at least a portion of the first regrowth layers to form a tunnel junction pattern; performing a second regrowth to form second regrowth layers; and bonding a second reflector form onto the second regrowth layers and removing a second substrate. The second reflector form comprises a second reflector and the second substrate.

BRIEF DESCRIPTION OF THE DRAWING(S)

Having thus described the invention in general terms, reference will now be made to the accompanying drawings, which are not necessarily drawn to scale, and wherein:

DETAILED DESCRIPTION OF THE INVENTION

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "top," "bottom," "front," etc. are used for explanatory purposes in the examples provided below to describe the relative position of certain components or portions of components. Accordingly, as an example, the term "top current spreading layer" may be used to describe a current spreading layer; however, the current spreading layer may be on the top or on the bottom, depending on the orientation of the particular item being described. As used herein, the terms "approximately" and "substantially" refer to within tolerances within appropriate manufacturing and/or engineering standards.

As described above, VCSELs are generally fabricated on a wafer with a plurality of VCSELs being fabricated on the same wafer. Thermal expansion coefficient differences between the GaAs-based layers and InP-based layers causes a technical problem in properly aligning the patterned features of the InP-based layers, which reduces the VCSEL fabrication efficiency.

For example, in the wafer fused VCSEL fabrication approach, the built-in current confinement aperture is formed by regrowth of a patterned epitaxial structure grown on an InP substrate to form a patterned active region blank. The patterning is fabricated by etching the certain amount of epi material through a mask, which defines the areas of the current confinement aperture with diameter d as well as the pitch w, for example d=6 µm and w=250 µm respectively. As a result of different values of thermal expansion coefficients of GaAs and InP wafers, the sizes of the mask patterned features change after the bonding of the patterned active region blank to the reflector blank at elevated temperatures. The measured value of the relative size change is in the range of (0.06+/−0.04) %, which results in a (6+/−4) µm/cm size change depending on wafer bonding process parameters.

To address the technical problems with aligning the VCSEL device features (e.g., second reflector, contact positions, location where light is emitted from the VCSEL) to the wafer level built-in current confinement aperture, the current aperture is patterned using a mask with dimensions scaled to anticipate the changes that occur during the post-bonding cooling. However, experiments have failed to identify a scaling factor that is sufficiently well known and reproducible. This uncertainty in the experimental value of the scaling factor has translated into low reproducibility and low yield of functional VCSELs in mass production. Moreover, with increased wafer size (e.g., with wafers having at least one dimension, such as length, width, radius, and/or the like) approaching two inches, three inches, or larger, it is becoming increasingly difficult to keep accurate alignment between built-in current apertures formed on the InP epitaxial wafer of the patterned active region blank before bonding with VCSEL features (DBR and contact pads) fabricated after wafer bonding. Therefore, there is a need for a technical solution to the technical problem of fabricating VCSELs on a large wafer with appropriate alignment between the VCSEL features.

Figure 3A:
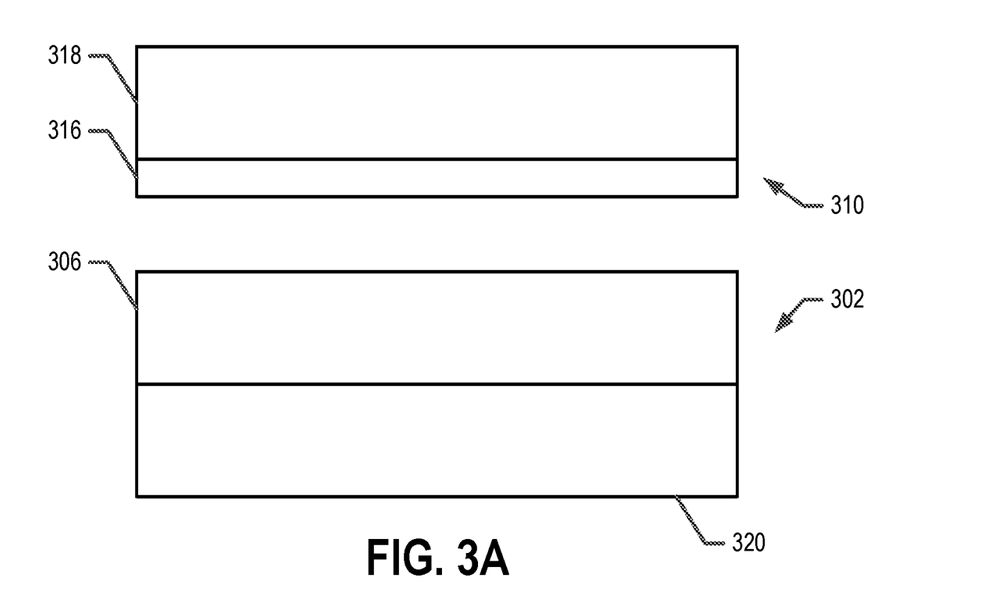
FIGS. 3A-3F illustrate schematic views of VCSEL components according to an example embodiment.
Figure 3B:
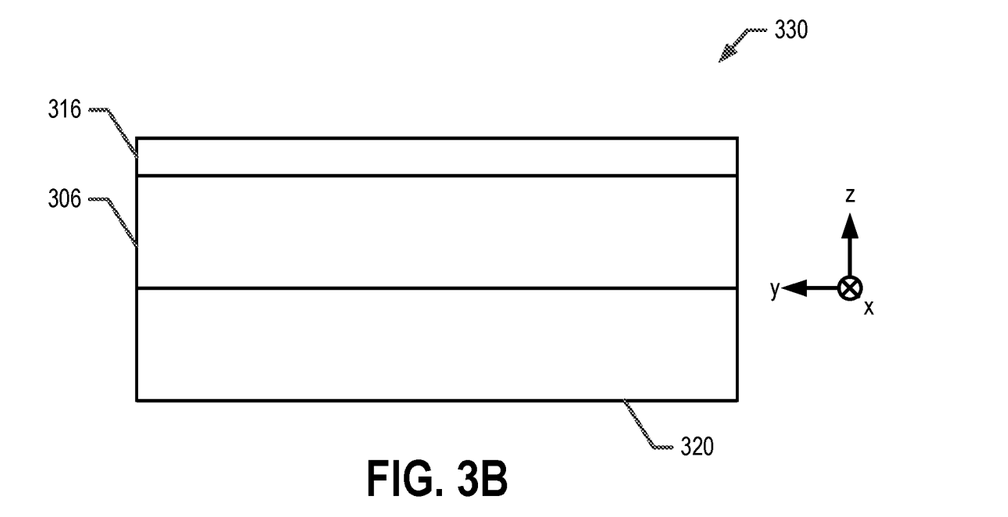

Various embodiments present technical solutions to the technical problem of fabricating a plurality of VCSELs on a (large) wafer with accurate alignment. In various embodiments, the bonding of InP-based layers (e.g., in the form of an un-patterned partial epi layer form) onto a first reflector form is performed. After the bonding of the partial epi layer form onto the first reflector form, the resulting bonded blank is substantially the same and/or consistent in any direction within a particular xy plane (as shown in FIG. 3B). For example, after the bonding of the partial epi layer form onto the first reflector form, in any xy plane of the resulting bonded blank the material of the bonded blank is substantially non-varying. In other words, there are no features to align at this point in the fabrication of the VCSEL. The patterned features of the VCSEL may then be formed via growth and patterning processes on the bonded blank such that the alignment difficulties that occur in traditional VCSEL fabrication are prevented in various embodiments of the present invention.

Figure 1:
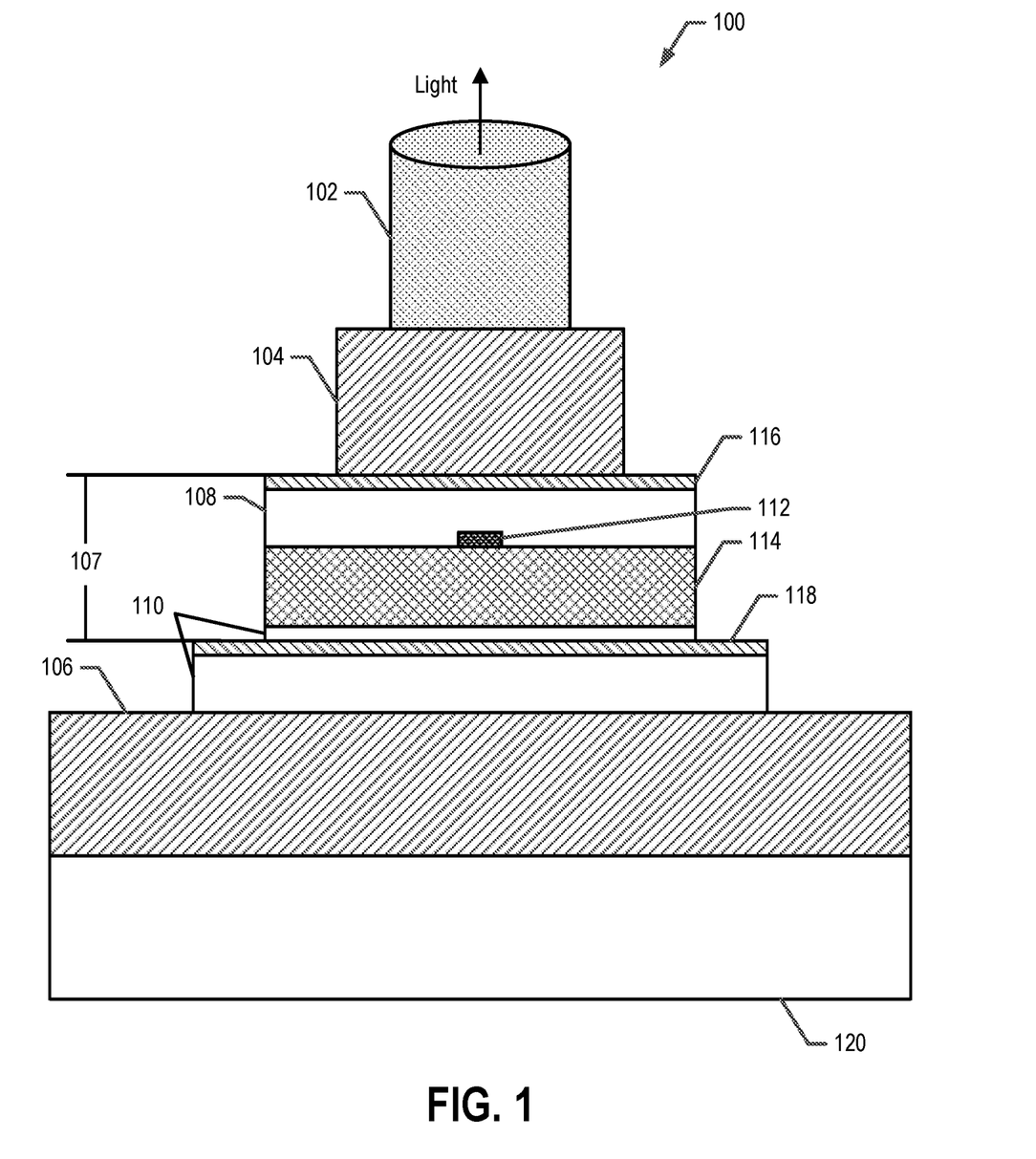
FIG. 1 illustrates a schematic cross-sectional view of a vertical-cavity surface-emitting laser (VCSEL), in accordance with an example embodiment.

FIG. 1 illustrates a vertical-cavity surface-emitting laser (VCSEL) 100. In various embodiments, a VCSEL 100 is configured to emit light 102 for use in a variety of applications, such as fiber optic data transmission in high-speed fiber optic communication systems. Wafer-fused VCSELs, such as the one illustrated in FIG. 1, demonstrate good performance in continuous wave (CW) and high speed data transmission, as well as reliable operations important for applications in fiber-optics communication systems. In particular, conventional wafer-fused VCSELs have generally demonstrated both electrical and mechanical durability, such that the VCSELs can be deployed and remain in operation for long periods of time, which is important when constructing a fiber optic network that may face many different environments and stress conditions.

In various scenarios, a plurality of VCSELs 100 may be generated on a large wafer. The VCSELs 100 may then be separated via a dicing procedure. In an example embodiment, a large wafer has at least one dimension (e.g., length, width, or radius) larger than two inches.

The structure of the VCSEL 100 includes an active material structure disposed between two reflectors. For example, FIG. 1 illustrates the active material structure 107 disposed between a first reflector 106 and a second reflector 104. The active material structure 107 comprises an active region 114. The active material structure 107 further includes a tunnel junction mesa 112 that is overgrown with a top current spreading layer 108 and a set of bottom current spreading layers 110. The first and second contact layers 116 and 118 provide electricity to the top and bottom current spreading layers 108, 110, which in turn provide electricity to the active region 114. The VCSEL 100 structure may be formed on a substrate such as substrate 120. In various embodiments, the substrate 120 is a section of the large wafer.

The current spreading layers 108 and 110 may comprise n-type indium phosphide (n-InP) layers. In the depicted embodiment, providing the electrical contacting through the n-type current spreading layers allows for the first reflector 106 and the second reflector 104 to each comprise un-doped semiconductor distributed Bragg reflector (DBR) mirrors. For example, the first reflector 106 and the second reflector 104 may comprise un-doped alternating layers of aluminum gallium arsenide (AlGaAs) and gallium arsenide (GaAs). In some examples, the manufacturing process of the VCSEL creates a top mesa type structure as shown by the active region 114, the top current spreading layer 108, and the second reflector 104. The mesa structure is formed on top of the underlying structures (e.g., bottom current spreading layer 110, first reflector 106, substrate 120, and/or the like). This manufacturing process can include reactive ion etching (RIE) and chemical etching through the various layers. In an example embodiment, at least a portion of the active material structure 107 is undercut in a manner similar to that described in U.S. Pat. No. 10,396,527, issued Aug. 27, 2019.

In some examples, the active region 114 may comprise quantum wells, where light 102 is generated, between the reflectors 104 and 106. In some examples, the active region 114 may comprise a multi-quantum well (MQW) layer stack comprising a series of quantum wells disposed between a series of barriers, a p-type region (layer) disposed between the top current spreading layer and the MQW layer stack outside the tunnel junction, and a tunnel junction 112 disposed on the p-type region (layer).

In the depicted VCSEL 100 of FIG. 1, the tunnel junction 112 serves a dual role of optical (photon) and electrical (current) confinement. The tunnel junction 112 may, for example, comprise an overgrown region which provides both current and photon confinement. In this example, the current is confined by the reverse p-n junction that is formed at the interface between the top current spreading layer 108 and the p-layer of the tunnel junction 112. The optical confinement is defined by the tunnel junction 112 representing an aperture for emitting light 102 and is determined by the width (or diameter) of the tunnel junction.

In various embodiments, the VCSEL 100 is configured to transmit data through single mode optical fibers with a modulation speed of up to 50 gigabits per second (Gb/s) or faster. In various embodiments, the VCSEL 100 may emit light 102 having a wavelength in the approximately 1200 nm to 2000 nm range.

Figure 2:
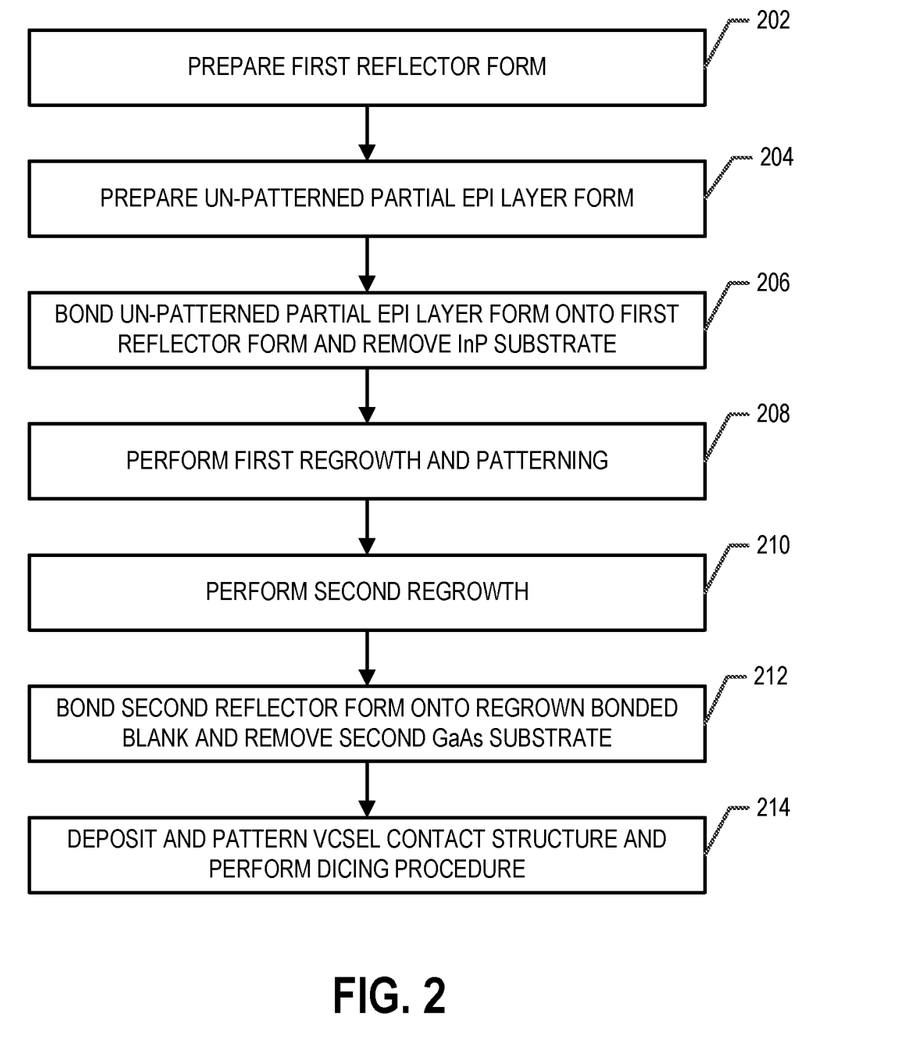
FIG. 2 provides a flowchart illustrating various processes, procedures, and/or operations for fabricating a VCSEL in accordance with an example embodiment.

FIG. 2 provides a flowchart illustrating various processes, procedures, operations, and/or the like for fabricating VCSELs 100 on a large wafer, in accordance with various embodiments of the present invention. Starting at step/operation 202, a first reflector form 302 is prepared. FIG. 3A illustrates an example first reflector form 302. In various embodiments, the first reflector form 302 comprises a first reflector layer 306 formed on a wafer 320. For example, the first reflector layer 306 (e.g., DBR and/or reflector stacks) are formed on the wafer 320. In an example embodiment, the wafer 320 is a large wafer and a plurality of VCSELs 100 are to be formed from the first reflector form 302. In an example embodiment, the first reflector form 302 comprises a wafer 320 (e.g., comprising and/or made of GaAs), a buffer layer (e.g., a GaAs buffer approximately 100 nm thick, and/or the like), and alternating high and low refractive index layers that form a first reflector layer 306. For example, the first reflector layer 306 may comprise 20-50 alternating high and low refractive index layer pairs. For example, the high refractive index layers may comprise GaAs and the low refractive index layers may comprise $Al_xGa_{(1-x)}As$.

Continuing with FIG. 2, at step/operation 204, an un-patterned partial epi layer form 310 comprises an InP substrate 318 and a plurality of un-patterned epitaxially grown layers 316, as shown in FIG. 3A. The un-patterned partial epi layer form 310 is referred to herein as a partial epi layer form because the un-patterned partial epi layer form 310 only comprises the epitaxially grown layers that do not require patterning. In various embodiments, the un-patterned epitaxially grown layers 316 comprise one or more layers of InP and $In_xGa_{(1-x)}As_yP_{(1-y)}$. In an example embodiment, the un-patterned epitaxially grown layers 316 are grown (e.g., epitaxially grown) and/or deposited onto the InP substrate 318. In an example embodiment, the plurality of un-patterned epitaxially grown layers 316 comprises a fusion layer for bonding to the first reflector layer 306, a spacer layer, and an N-contact layer. In an example embodiment, the fusion layer and/or the N-contact layer comprises $In_xGa_{(1-x)}As_yP_{(1-y)}$. In an example embodiment, the spacer layer is sandwiched between the fusion layer and the N-contact layer and comprises InP. In an example embodiment, the InP substrate comprises one or more etch stop layers, a buffer, and a substrate body. For example, the one or more etch stop layers may comprise InP and/or $In_xGa_{(1-x)}As_yP_{(1-y)}$. In an example embodiment the buffer comprises InP. In an example embodiment, the substrate body comprises N-type InP.

Returning to FIG. 2, at step/operation 206, the partial epi layer form 310 is bonded onto the first reflector form 302. For example, a first surface of the plurality of un-patterned InP type layers may be bonded to a second surface of the bottom reflector layer 306. For example, the fusion layer of the plurality of un-patterned epitaxially grown layers 316 may be bonded to a second surface of the bottom reflector layer 306. In an example embodiment, the first surface of the bottom reflector layer 306 abuts and/or is secured to the wafer 320 and/or buffer layer. As the plurality of un-patterned epitaxially grown layers 316 is not patterned, alignment between the partial epi layer form 310 and the first reflector form 302 need not be exact or precise and is not affected by shrinking of any of the layers as the resulting bonded blank 330 cools after the bonding is performed. For example, bonding of the un-patterned partial epi layer form 310 to the first reflector form 302 may include heating the partial epi layer form 310 and the first reflector form 302 to relatively high temperatures. For example, the bonding process may occur at temperatures greater than 500° C. (e.g., at approximately 600° C., in an example embodiment). In various embodiments, the bonding of the un-patterned partial epi layer form 310 to the first reflector form 302 may include heating the un-patterned partial epi layer form 310 and the first reflector form 302 to a high temperature (e.g., approximately 600° C.) and applying pressure such that mixing occurs on an atomic mono-layer scale between the two adjacent/bonded layers of the un-patterned partial epi layer form 310 and the first reflector form 302 to form the bonded blank 330. As the layers of the resulting bonded blank 330 cool, the differences in the thermal expansion coefficient between the layers of the first reflector form 302 (e.g., a GaAs-based layer) and the layers of the partial epi layer form 310 (e.g., an InP-based layer) may cause differential shrinking of various layers of the bonded blank 330. However, as no patterning has yet been performed, the fabrication process is tolerant of the differential shrinking and the differential shrinking does not raise alignment concerns. For example, the bonded blank 330 does not include any substantial variation in any xy plane. In other words, within any xy plane, the properties of the bonded blank 330 are approximately and/or substantially constant. In an example embodiment, an xy plane, as shown in FIG. 3B, is normal, orthogonal, and/or perpendicular to the intended emission direction of the VCSEL. The intended emission direction of the VCSEL is the direction in which light 102 is emitted from the VCSEL and is generally parallel to the z-direction, as illustrated in FIG. 1.

After the partial epi layer form 310 is bonded onto the first reflector form 302, the InP substrate 318 may be removed (e.g., via etching). For example, a wet or dry etching process may be performed (e.g., taking advantage of the one or more etch stop layers of the InP substrate 318) to remove the InP substrate 318. The result of removing the InP substrate 318 is the bonded blank 330 illustrated in FIG. 3B.

Continuing with FIG. 2, at step/operation 208, a first regrowth and patterning process is performed. For example, a first regrowth process may be performed to grow (e.g., epitaxially grow) first regrowth layers on the un-patterned epitaxially grown layers. A patterning process may then be used to pattern at least a portion of the first regrowth layers to form a tunnel junction pattern. For example, an active region layer 332 may be grown on the second surface of the plurality of un-patterned epitaxially grown layers 316. FIG.

Figure 3C:
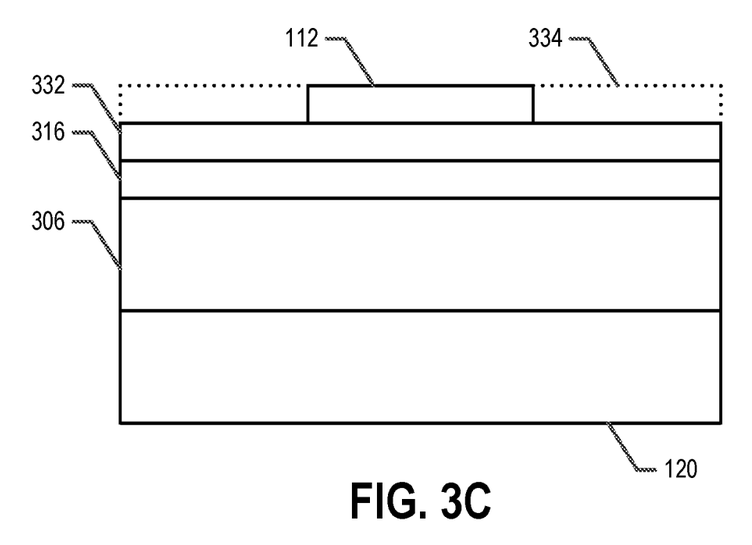

3C illustrates the result of performing the first regrowth process and the patterning process for a portion of the wafer 320 corresponding to one VCSEL. For example, the portion of the wafer 320 shown in FIG. 3C corresponds to the substrate 120 of the VCSEL 100. In the first regrowth process, for example, a multi-quantum well (MQW) layer stack may be grown on the second surface of plurality of un-patterned InP type layers 316. For example, the first regrowth process may include growing a spacer layer, a first barrier, a multi-quantum well layer stack, a second barrier, a P-type InAlAs layer, and/or a P-type InP layer to form the active region layer 332. In an example embodiment, the spacer layer comprises InP. In an example embodiment, the MQW layer stack is sandwiched between the first and second buffer layers. In an example embodiment, the first buffer layer, second buffer layer, and/or MQW layer stack comprises $In_xAl_yGa_{(1-x-y)}As$.

In various embodiments, a tunnel junction layer 334 may be formed as part of the first regrowth process. In various embodiments, the tunnel junction layer 334 comprises one or more tunnel junction sublayers. For example, the tunnel junction layer 334 may comprise a p++ tunnel junction sublayer and an n++ tunnel junction sublayer. For example, the p++ and/or n++ tunnel junction sublayers may comprise appropriately doped layers of $In_xAl_yGa_{(1-x-y)}As$. The tunnel junction layer 334 may then be patterned to form the tunnel junctions 112 of the VCSELs 100 being formed on the wafer 320. For example, the tunnel junction layer 334 may be etched (e.g., using a mask and/or the like) to form a plurality of tunnel junctions 112 on the bonded blank 330. Each tunnel junction 112 corresponds to a VCSEL 100 being formed on the wafer 320. In various embodiments, the tunnel junction layer 334 is etched to form a plurality of tunnel junctions 112 having a particular diameter (e.g., defined by the VCSEL design). The locations of the tunnel junctions 112 on the bonded blank 330 are well known and accurately known due to the etching process used to form the tunnel junctions 112. The dotted lines in FIG. 3C indicate the removal of a portion of the tunnel junction layer 334 to form the tunnel junction 112.

Figure 3D:
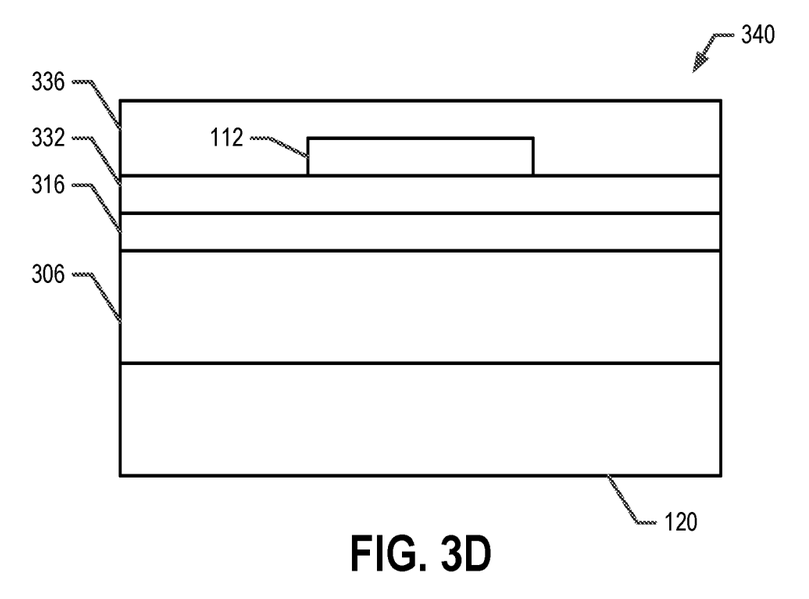

Returning to FIG. 2, at step/operation 210, a second regrowth process is performed. For example, a second regrowth layer (and/or layer stack) 336 may be grown and/or deposited onto the active region layer 332 and/or onto and/or around the tunnel junctions 112. In an example embodiment, the second regrowth layer (and/or layer stack) 336 comprises elements that will become the top current spreading layer 108 and/or the second contact layer 116 of a VCSEL 100. For example, one or more growth and/or deposition processes may be used to grow and/or deposit the second regrowth layer (and/or layer stack) 336 onto the active region layer 332 and tunnel junctions 112 grown and/or patterned at step/operation 208. For example, the second regrowth layer (and/or layer stack) 336 may include one or more spacer layers and a second contact layer may be grown and/or deposited onto the active region layer 332 and/or junctions 112. For example, the one or more spacer layers may comprise InP. In an example embodiment, the second contact layer comprises $In_xGa_{(1-x)}As_yP_{(1-y)}$. For example, FIG. 3D illustrates a portion of a regrown bonded blank 340 corresponding to one VCSEL 100 and comprising the second regrowth layer 336, a tunnel junction 112, the active region layer 332, the plurality of un-patterned epitaxially grown layers 316, the first reflector layer 306, and the substrate 120.

Figure 3E:
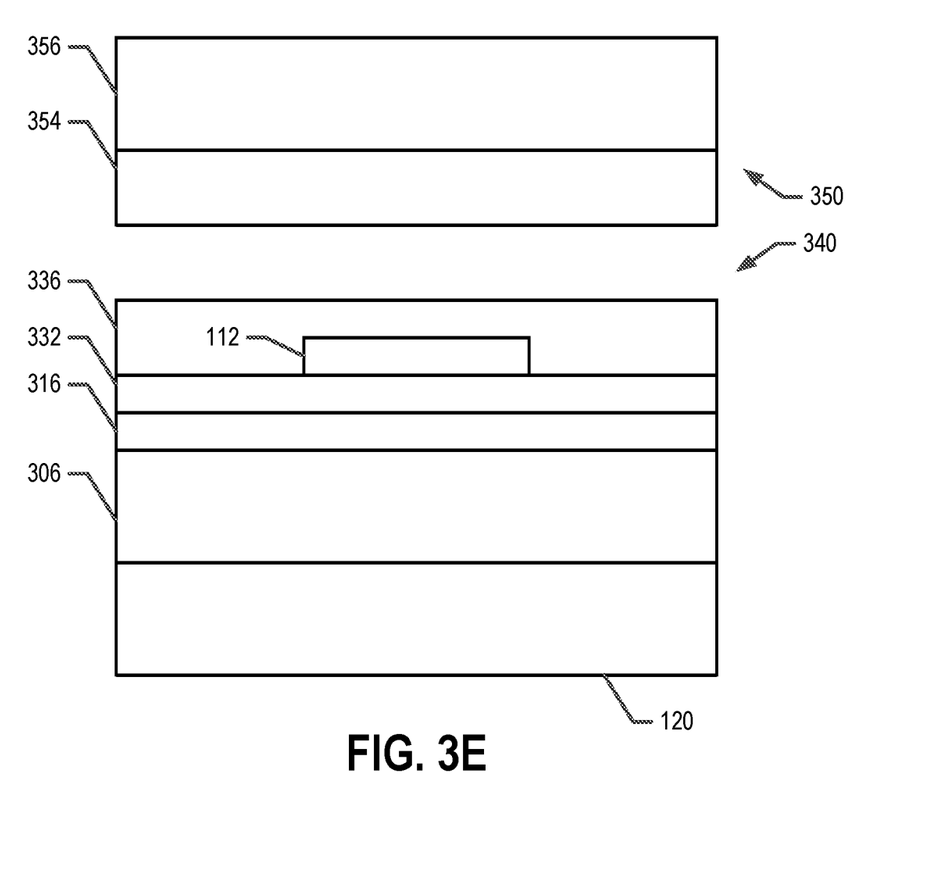

Continuing with FIG. 2, at step/operation 212, a second reflector form 350 is prepared and bonded onto the regrown bonded blank 340. As shown in FIG. 3E, the second reflector form 350 comprises a second GaAs substrate/wafer 356 and a second reflector layer 354. The second reflector layer 354 (e.g., DBR and/or reflector stacks) are formed on the second GaAs substrate/wafer 356. In an example embodiment, the second reflector form 350 comprises a second GaAs substrate/wafer 356 (e.g., comprising and/or made of GaAs), a buffer layer (e.g., a GaAs buffer approximately 100 nm thick, and/or the like), an etch stop layer (e.g., a $Al_xGa_{(1-x)}As$ etch stop layer), and alternating high and low refractive index layers that form a second reflector layer 354. For example, the second reflector layer 354 may comprise 10-50 alternating high and low refractive index layer pairs. For example, the high refractive index layers may comprise GaAs and the low refractive index layers may comprise $Al_xGa_{(1-x)}As$.

Figure 3F:
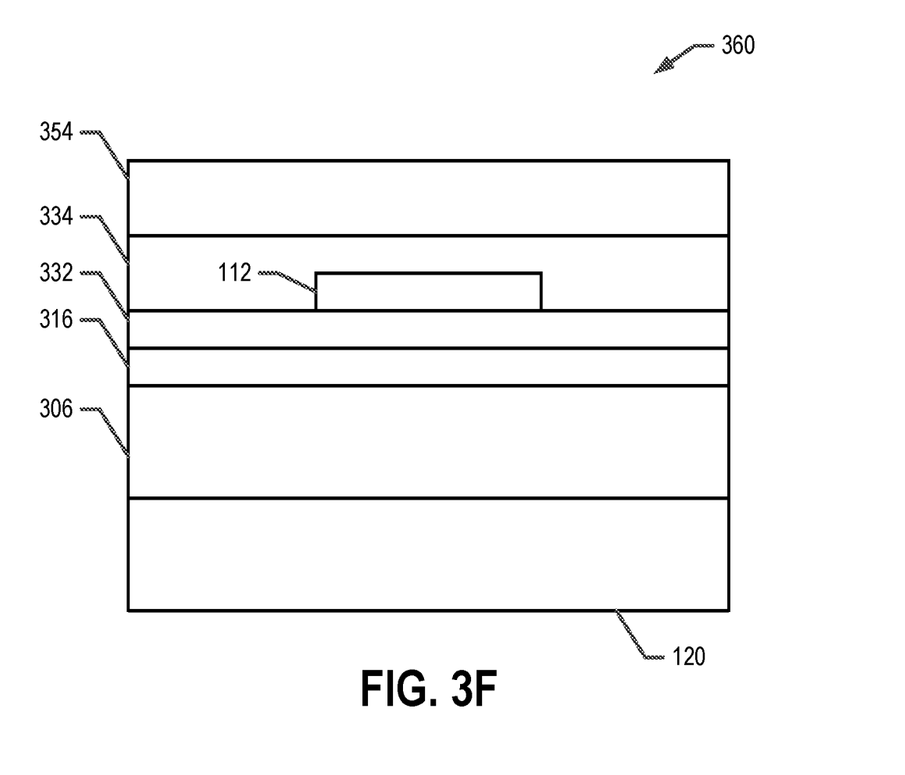

The second reflector form 350 may then be bonded onto the regrown bonded blank 340. As both the second reflector form 350 and the regrown bonded blank 340 are based on GaAs substrates/wafers, the bonding of the second reflector form 350 onto the regrown bonded blank 340 does not result in differential shrinkage between patterned layers. In other words, the bonding of the second reflector form 350 onto the regrown bonded blank 340 does not result in alignment issues. Once the second reflector form 350 has been bonded onto the regrown bonded blank 340, the second GaAs substrate/wafer 356 may be removed. For example, an etching process may be used to remove the second GaAs substrate/wafer 356 (e.g., taking advantage of the etch stop layer of the second reflector form 350). FIG. 3F illustrates an example VCSEL blank 360 resulting from the second GaAs substrate/wafer 356 being removed after the second reflector form 350 is bonded onto the regrown bonded blank 340.

At step/operation 214, processes, procedures, and/or operations may be performed to transform the wafer 320 of VCSEL blanks 360 into individual VCSELs 100. For example, mesa patterning may be performed, in an example embodiment. For example, one or more etching processes may be used to form one or more mesa structures for each VCSEL. For example, the mesa patterning may comprise etching a mesa structure about a location where a tunnel junction 112 is known to be located. In an example embodiment, one or more metal contacts and/or contact pads may be deposited and/or patterned on the VCSEL blanks 360. For example, the contacts and/or contact pads may be configured for wire bonding and/or various components of the VCSEL 100 may otherwise by placed into electrical communication with one or more control signals and/or ground. In an example embodiment, a dicing procedure may be used to separate the plurality of VCSELs 100 formed on the large wafer 320. In an example embodiment, one or more of the VCSELs 100 may be tested before the dicing procedure is performed. Various other finishing steps may be performed to finish the VCSEL 100 and/or to incorporate the VCSEL into a transmitter and/or transceiver device and/or the like.

For example, at step/operation 214, various processes, procedures, and/or operations may be performed such that, for each VCSEL 100 formed on the wafer 320, each VCSEL is fabricated to include a substrate 120 formed from a portion of the wafer 320, a first reflector 106 formed from a portion of the first reflector layer 306, a bottom current spreading layer 110 and a first contact layer 118 formed from a portion of the un-patterned epitaxially grown layers 316, an active region formed from a portion of the active region layer 332, a tunnel junction 112 formed from the patterning of the tunnel junction layer 334, a top current spreading layer 108 and a second contact layer 116 formed from a portion of the second regrowth layer (and/or layer stack) 336, and a second reflector 104 formed from a portion of the second reflector layer 354.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for fabricating a vertical cavity surface emitting laser (VCSEL), the method comprising:
    bonding an un-patterned epi layer form onto a first reflector form, the first reflector form comprising a first reflector layer and a wafer of a first substrate type, the un-patterned epi layer form comprising a plurality of un-patterned epitaxially grown layers on a wafer of a second substrate type, the first substrate type and the second substrate type having different thermal expansion coefficients;
    removing the wafer of the second substrate type to form a bonded blank, wherein the bonded blank is substantially non-varying in an xy plane, the xy plane being normal to an intended emission direction of the VCSEL;
    performing a first regrowth to form first regrowth layers on the un-patterned epitaxially grown layers;
    patterning at least a portion of the first regrowth layers to form a tunnel junction pattern;
    performing a second regrowth to form second regrowth layers; and
    bonding a second reflector form onto the second regrowth layers and removing a second reflector substrate, the second reflector form comprising a second reflector layer and the second reflector substrate.

2. A method for fabricating vertical cavity surface emitting lasers (VCSELs) on a large wafer, the method comprising:
    forming a first reflector form on the wafer by forming a first reflector layer on the wafer;
    bonding an un-patterned epi layer form onto the first reflector form, the un-patterned epi layer form comprising a plurality of un-patterned epitaxially grown layers on a first substrate;
    removing the first substrate to form a bonded blank, wherein the bonded blank is substantially non-varying in an xy plane, the xy plane being normal to an intended emission direction of the VCSELs;
    performing a first regrowth to form first regrowth layers on the un-patterned epitaxially grown layers;
    patterning at least a portion of the first regrowth layers to form a tunnel junction pattern;
    performing a second regrowth to form second regrowth layers;
    bonding a second reflector form onto the second regrowth layers and removing a second substrate, the second reflector form comprising a second reflector layer and the second substrate; and
    performing a dicing operation to form individual VCSELs.

3. The method of claim 2, wherein the wafer has at least one dimension that is at least three inches.

4. The method of claim 2, wherein the wafer comprises GaAs, the first substrate comprises InP, and the second substrate comprises GaAs.

5. The method of claim 2, wherein at least a portion of the first regrowth layers forms an active region of a VCSEL of the individual VCSELs.

6. The method of claim 2, wherein at least a portion of the un-patterned epitaxially grown layers forms a first contact layer and/or a first current spreading layer of a VCSEL of the individual VCSELs.

7. The method of claim 2, wherein at least one of the first reflector layer or the second reflector layer comprises a distributed Bragg reflector (DBR) stack.

8. The method of claim 7, wherein the DBR stack comprises un-doped alternating layers of aluminum gallium arsenide (AlGaAs) and gallium arsenide (GaAs).

9. The method of claim 2, wherein a first patterning process of the fabrication of the VCSELs on the wafer is performed after the bonding of the un-patterned epi layer form onto the first reflector form.

10. The method of claim 2, further comprising depositing and patterning one or more metal contacts onto a VCSEL of the individual VCSELs.

11. The method of claim 2, wherein alignment of one or more patterned features of a VCSEL of the individual VCSELs is independent of the bonding of the un-patterned epi layer form onto the first reflector form and the bonding of the second reflector form onto the second regrowth layers.

12. The method of claim 2, wherein the first regrowth layers comprise
    a multi-quantum well (MQW) layer stack comprising a series of quantum wells disposed between a series of barriers; and
    a p-type region disposed between a second current spreading layer of the second regrowth layers and the MQW layer stack.

13. The method of claim 12, wherein the plurality of un-patterned epitaxially grown layers comprise a first current spreading layer and the p-type region is disposed between the first current spreading layer and the second current spreading layer, including the MQW layer stack.

14. The method of claim 12, wherein the second current-spreading layer and the p-type region form a reversed-bias p-n junction formed around the tunnel junction, wherein the reversed-bias p-n junction is configured to block a current around the tunnel junction with low capacitance.

15. The method of claim 2, wherein the tunnel junction comprises a heavily doped p++/n++ indium aluminum gallium arsenide tunnel junction.

16. The method of claim 2, wherein the tunnel junction defines an optical aperture for a laser light emitted by a VCSEL of the individual VCSELs.

17. The method of claim 2, wherein the bonding of the un-patterned epi layer form onto the first reflector form is performed at a temperature greater than 500° C.

18. The method of claim 2, further comprising incorporating a VCSEL of the individual VCSELs into a transmitter or transceiver device.

19. A method for fabricating vertical cavity surface emitting lasers (VCSELs) on a large wafer, the method comprising:
    forming a first reflector form on the wafer by forming a first reflector layer on the wafer;
    bonding an un-patterned epi layer form onto the first reflector form, the un-patterned epi layer form comprising a plurality of un-patterned epitaxially grown layers on a first substrate;

removing the first substrate to form a bonded blank, wherein the bonded blank consists of un-patterned layers;
performing a first regrowth to form first regrowth layers on the un-patterned epitaxially grown layers;
patterning at least a portion of the first regrowth layers to form a tunnel junction pattern;
performing a second regrowth to form second regrowth layers;
bonding a second reflector form onto the second regrowth layers, the second reflector form comprising a second reflector layer and a second substrate; and
performing a dicing operation to form individual VCSELs.

20. The method of claim 19, wherein the wafer has at least one dimension that is at least three inches.

* * * * *